United States Patent [19]

Ishida

[11] Patent Number: 6,117,347
[45] Date of Patent: Sep. 12, 2000

[54] METHOD OF SEPARATING WAFERS INTO INDIVIDUAL DIE

[75] Inventor: Hisashi Ishida, Tokyo, Japan

[73] Assignee: NEC Corporation, Tokyo, Japan

[21] Appl. No.: 08/890,944

[22] Filed: Jul. 10, 1997

[30] Foreign Application Priority Data

Jul. 10, 1996 [JP] Japan .................................. 8-179723

[51] Int. Cl.⁷ .................................................. H01L 21/786
[52] U.S. Cl. .......................... 216/52; 438/462; 438/465; 438/113; 438/460; 216/17; 216/65
[58] Field of Search .................................. 438/460, 462, 438/463, 465, 113; 216/52, 17, 65, 66, 67

[56] References Cited

U.S. PATENT DOCUMENTS

| | | | |
|---|---|---|---|
| 4,617,085 | 10/1986 | Cole, Jr. et al. ............................ | 216/66 |
| 5,157,001 | 10/1992 | Sakuma ..................................... | 438/462 |
| 5,171,716 | 12/1992 | Cagan et al. .............................. | 438/113 |
| 5,337,466 | 8/1994 | Ishida ....................................... | 29/830 |
| 5,521,125 | 5/1996 | Ormond et al. .......................... | 347/20 |
| 5,593,927 | 1/1997 | Farnworth et al. ...................... | 438/113 |
| 5,597,767 | 1/1997 | Mignardi et al. ......................... | 438/14 |
| 5,736,453 | 4/1998 | Kadonishi . | |
| 5,786,266 | 7/1998 | Boruta . | |
| 5,811,019 | 9/1998 | Nakayama et al. ....................... | 216/27 |

FOREIGN PATENT DOCUMENTS

| | | |
|---|---|---|
| 2113019 | 7/1994 | Canada . |
| 2119505 | 9/1994 | Canada . |
| 2129212 | 7/1998 | Canada . |
| 1-98248 | 4/1989 | Japan . |
| 2-215504 | 8/1990 | Japan . |
| 3-263853 | 11/1991 | Japan . |
| 4-35051 | 2/1992 | Japan . |
| 5-95046 | 4/1993 | Japan . |
| 5-338237 | 12/1993 | Japan . |
| 8-130197 | 5/1996 | Japan . |

OTHER PUBLICATIONS

"Method of Preventing Damage to Integrated Circuit Chips During Wafer Dicing", *IBM Technical Disclosure Bulletin*, vol. 34, No. 12, May 1, 1992, pp. 311–312.

*Primary Examiner*—Frankie L. Stinson
*Assistant Examiner*—Shamim Ahmed
*Attorney, Agent, or Firm*—Sughrue, Mion, Zinn, Macpeak & Seas, PLLC

[57] ABSTRACT

A method of separating a wafer into individual die is disclosed. The wafer includes a substrate with organic thin-film multiple layers. A portion of the organic multiple layers is etched along a scribe line with excimer laser to form a groove to expose a portion of the substrate before sawing the substrate along the scribe line with a saw blade. Plasma etching or ion beam etching or sand blasting is an alternative to the excimer laser.

5 Claims, 5 Drawing Sheets

METHOD OF SEPARATING WAFERS INTO INDIVIDUAL DIE

BACKGROUND OF THE INVENTION

1. Field of the Invention

The present invention relates to a method of separating wafers into individual die for final packaging, and more particularly to an improvement in such a method using a blade for separating the die.

2. Description of the Related Art

The wafers, each being comprised of organic multiple layers on a substrate, are placed on a wafer probe, and the individual die on each wafer are tested. Those devices that function properly are left alone, while those that fail are marked. With the devices or circuits on the wafer tested, the wafers are separated into individual die for final packing. This operation is generally called "wafer scribe". A commonly used method to separate die is sawing. A rotating saw blade is used to separate the die. The rotating saw blade is drawn through the organic multiple layers and the substrate at the same time along the scribe line.

JP-A 5-95046 teaches a method of separating a wafer that is comprised of thin-film sensors attached to one side of a substrate. The substrate is formed with, by etching, holes to expose the thin-film sensors. Protection resin is painted to fill in the holes. An adhesive tape is attached to the substrate to cover the thin-film sensors to protect them during wafer scribe, by sawing, to separate die. The die are separated from the tape and the protection resin removed by dissolution. With this method, it is described that the thin-film sensors are not damaged.

Separating, in a conventional manner, a wafer involves simultaneously cutting through the organic thin film multiple layers and the substrate with the saw blade. Difference in coefficient of thermal expansion between the organic thin film layers and the substrate causes concentration of stress on a weak portion of the cutting section. The concentration of stress may cause the organic layers to peal off from the substrate if bond between the organic layers and the substrate is not tight. Further, it may cause the substrate to split to form notch in the cutting section if structural strength of the substrate is not sufficiently high.

The die that is subject to such a defect during wafer scribe will lose its commercial value, thus pushing up manufacturing cost of the tips.

An object of the present invention is to provide a method of separating wafers into individual die, which method, free from the above-mentioned problems, minimizes loss to the yield of good and reliable chips.

SUMMARY OF THE INVENTION

According to the present invention, there is provided a method of separating a wafer into individual die, the wafer including a substrate with organic multiple layers, the method comprising the steps of:

removing a portion of the organic multiple layers along a scribe line to form a groove to expose a portion of the substrate; and sawing said portion of the substrate along the scribe line with a saw blade that has a thickness less than a width of said groove.

DETAILED DESCRIPTION OF THE INVENTION

Figure 1A:
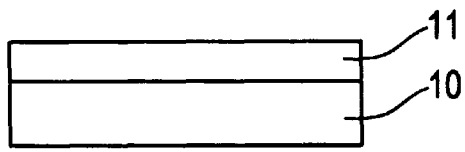
FIGS. 1(*a*), 1(*b*), 1(*c*) and 1(*d*) are schematic elevation diagrams illustrating various steps of a first embodiment of a method of separating a wafer into individual die.
Figure 1B:
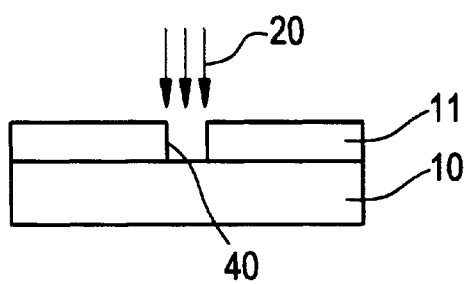
Figure 1C:
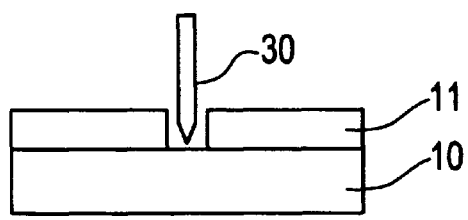
Figure 1D:
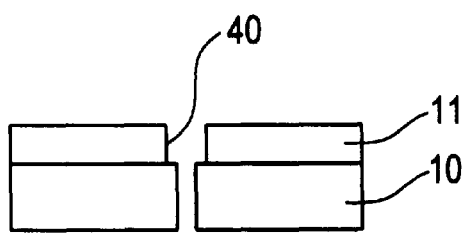
Figure 2A:
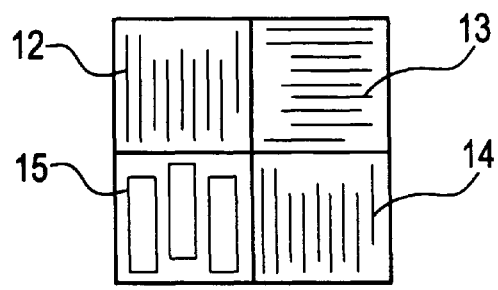
FIGS. 2(*a*), 2(*b*), 2(*c*) and 2(*d*) are schematic plan diagrams illustrating the various steps of the first embodiment.
Figure 2B:
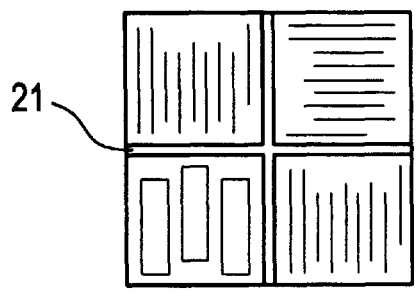
Figure 2C:
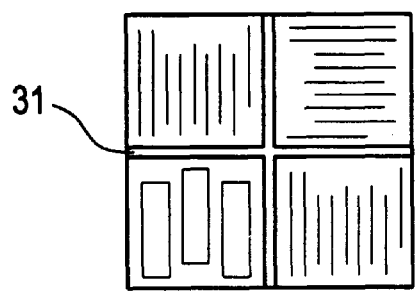
Figure 2D:
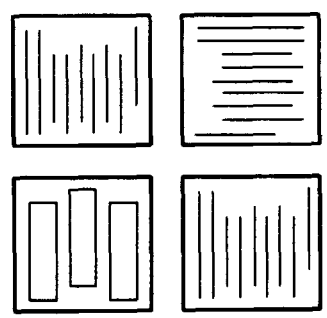
Figure 3A:
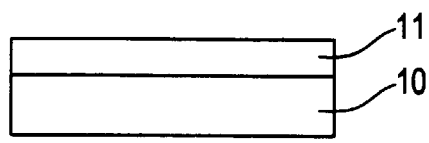
FIGS. 3(*a*), 3(*b*), 3(*c*) and 3(*d*) are schematic elevation diagrams illustrating various steps of a second embodiment of a method of separating die.
Figure 4A:
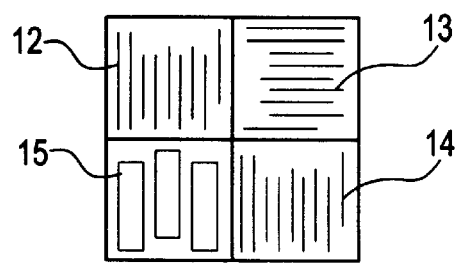
FIGS. 4(*a*), 4(*b*), 4(*c*) and 4(*d*) are schematic plan diagrams illustrating the various steps of the second embodiment.
Figure 3B:
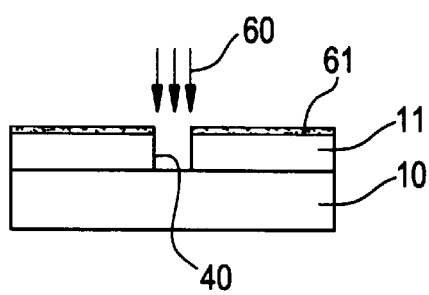
Figure 4B:
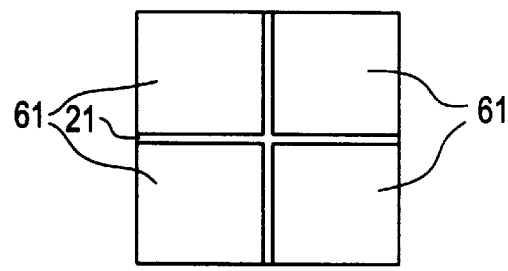
Figure 3C:
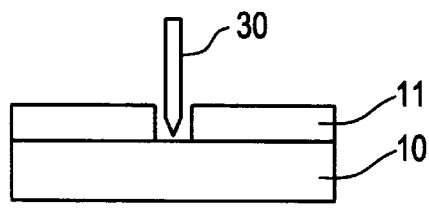
Figure 4C:
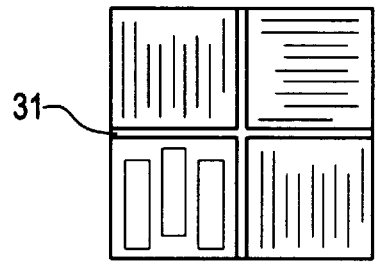
Figure 3D:
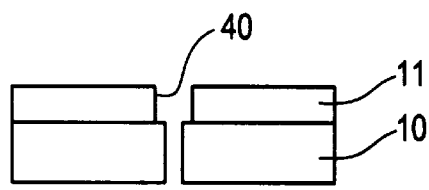
Figure 4D:
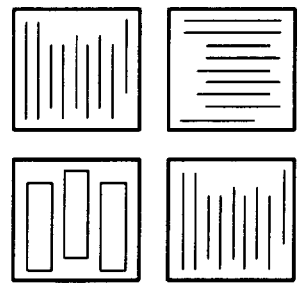
Figure 5A:
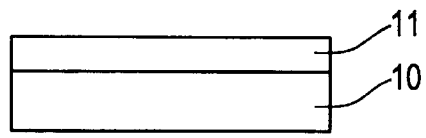
FIGS. 5(*a*), 5(*b*), 5(*c*) and 5(*d*) are schematic elevation diagrams illustrating various steps of a third embodiment of a method of separating die.
Figure 6A:
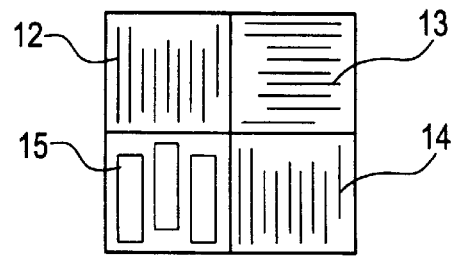
FIGS. 6(*a*), 6(*b*), 6(*c*) and 6(*d*) are schematic plan diagrams illustrating the various steps of the third embodiment.
Figure 5B:
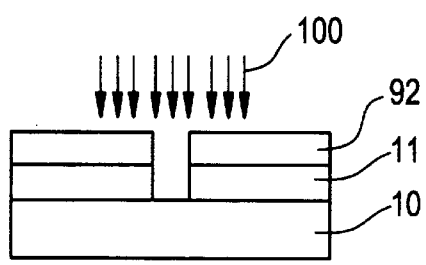
Figure 6B:
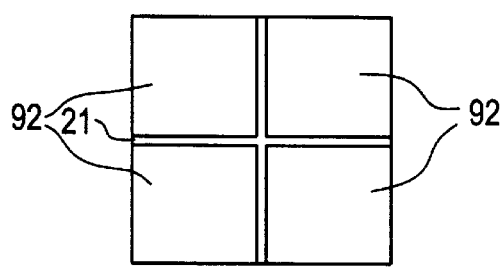
Figure 5C:
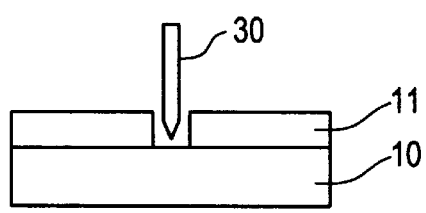
Figure 6C:
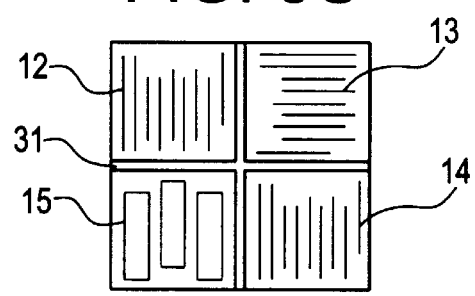
Figure 5D:
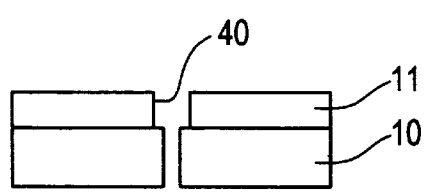
Figure 6D:
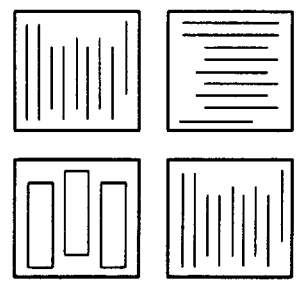
Figure 7A:
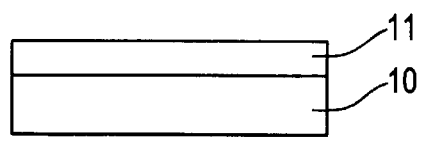
FIGS. 7(*a*), 7(*b*), 7(*c*) and 7(*d*) are schematic elevation diagrams illustrating various steps of a fourth embodiment of a method of separating die.
Figure 8A:
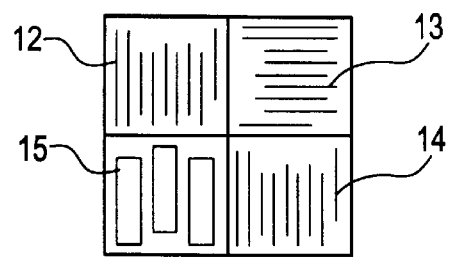
FIGS. 8(*a*), 8(*b*), 8(*c*) and 8(*d*) are schematic plan diagrams illustrating the various steps of the fourth embodiment.
Figure 7B:
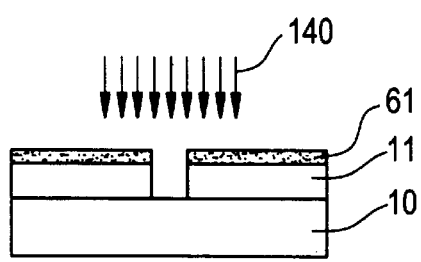
Figure 8B:
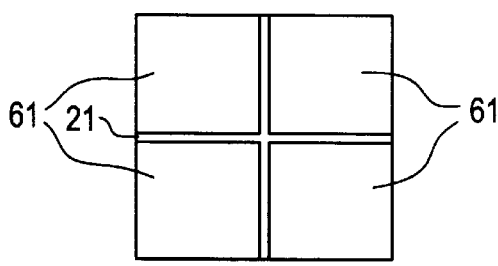
Figure 7C:
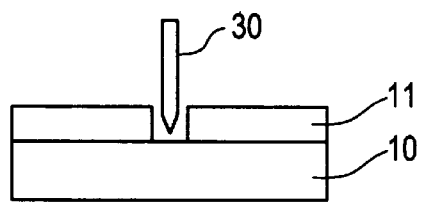
Figure 8C:
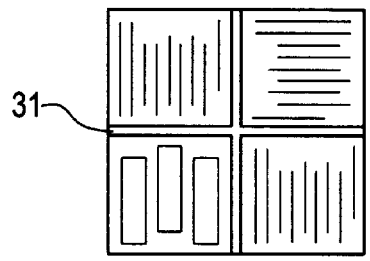
Figure 7D:
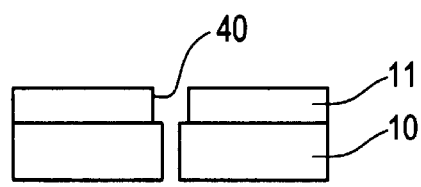
Figure 8D:
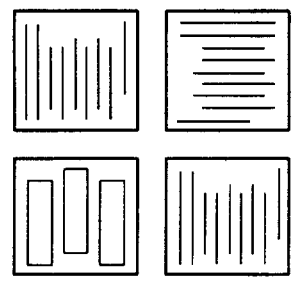

Referring to FIGS. 1(*a*) to 1(*d*) and FIGS. 2(*a*) to 2(*d*), the first embodiment according to the present invention is described. In FIG. 1(*a*), a wafer is comprised of a multiple-layered ceramic substrate 10. Deposited on the substrate 10 are organic thin-film multiple layers 11. The multiple layers 11 involves a plurality, four in this embodiment, of circuits 12, 13, 14 and 15, see FIG. 2(*a*). In this embodiment, the circuits 12, 13 and 14 belong to the same pattern and the circuit 15 belongs to a different pattern. The circuit 15 is designed for a special purpose.

The organic thin-film multiple layers 11 result from carrying out a sequentially laminating method in which a polyimide insulating layer forming process and a circuit layer forming process are repeated. The insulating layer forming process comprises the steps of applying polyimide precursor varnish to the multiple-layered ceramic substrate 10, drying the applied varnish to form an insulating layer and forming viaholes through the insulating layer. The circuit layer forming process uses photolithography, vacuum-vapor-deposition (VVD) and metal plating.

According to another method of forming the thin-film multiple layers 11, polyimide organic thin-film multiple-layered circuits are formed on auxiliary substrates, respectively. Such auxiliary substrates are located on and provisionally mounted on a ceramic multiple-layered substrate for subsequent heat treatment under pressure.

This method permits mounting only the circuits that have passed the test on the substrate. Indeed, this fabrication method is advantageous over the before-mentioned one in yield of good circuits. Besides, manufacturing days have been shortened because polyimide layers can be laminated on auxiliary substrates in parallel.

The wafers, which have been manufactured, are subject to separation along the scribe line. Conducting the wafer scribe provides chips having circuits 12, 13, 14 and 15. The circuit on each of the chips are independent. In embodiments according to the present invention, one wafer is separated into four chips.

As shown in FIGS. 1(*b*) and 2(*b*), excimer laser 20 removes organic thin-film layers along the scribe line 31 to form an etched groove 21. The excimer laser used in this embodiment is KrF excimer laser with oscillation frequency 200 Hz and energy density 0.8 J/cm$^2$. The number of shots to be irradiated is determined by thickness of the organic thin-film multiple layers to be removed. Masking is not needed because the excimer laser can shot the scribe line 31 with high precision. The organic thin-film multiple layers on the scribe line 31 are removed by abrasion due to irradiation of laser beam.

The width of the organic thin-film multiple layers 11 to be removed, i.e., the width of the etched groove 21, is wider than the thickness of saw blade 30. For example, if the thickness of the blade 30 is 200 $\mu$m, the width to be removed ranges from 500 $\mu$m to 1 mm. Cutting section 40 resulting from etching the organic thin-film layers 11 with excimer laser is rough as compared to that resulting from sawing with the blade 30.

FIGS. 1(*c*) and 2(*c*) show sawing of the multiple-layered substrate 10 with the blade 30. As mentioned above, the blade 30 has a thickness less than the width of the etched groove 21. As the portion of the organic layers 11 that is disposed on the scribe line 31 has been removed, the ceramic multiple-layered substrate 10 is subjected to sawing with the blade 30. The multiple-layered substrate 10 is very hard, requiring for the saw blade 30 to repeat its operation several times along the same scribe line 31. For example, the saw blade 30 must repeat its operation three times along the same scribe line for separating the ceramic multiple-layered substrate with 2 mm thick.

As shown in FIGS. 1(*d*) and 2(*d*), as a result of the wafer scribe, the single wafer is separated into four chips with circuits 12, 13, 14 and 15.

Referring to FIGS. 3(*a*) to 3(*d*) and FIGS. 4(*a*) to 4(*d*), there is described a second embodiment according to the present invention. The second embodiment is substantially the same as the first embodiment except the use of plasma etching illustrated in FIGS. 3(*b*) and 4(*b*) instead of etching with excimer laser. Thus, the operations illustrated in FIGS. 3(*a*) and 4(*a*), FIGS. 3(*c*) and 4(*c*), and FIGS. 3(*d*) and 4(*d*) are the same as those illustrated in FIGS. 1(*a*) and 2(*a*), FIGS. 1(*c*) and 2(*c*), and FIGS. 1(*d*) and 2(*d*), respectively.

As shown in FIGS. 3(*b*) and 4(*b*), the plasma etching is used to remove organic thin-film multiple layers 11 along scribe line 31 to form etched groove 21. In this technique, a wafer with metal mask 61 is placed in a chamber that is evacuated. A small amount of reactive gas is allowed back into the chamber. An electromagnetic field is then applied, and the portion along the scribe line 31 that is not protected by the mask 61 is etched away by the excited etchant ions 60. A type of Freons containing oxygen ($O_2$) is used as the feeding gas to the chamber. The metal mask 61 is applied to protect those portions of the thin-film multiple layers 11 that are not to be etched. A resist mask may be used instead of the metal mask 61.

Power for ac plasma excitation ranges from 200 W to 1 KW. Speed at which organic resin is etched away by the plasma etching is slow as compared to speed at which the organic resin is etched away by the excimer laser. Thus, the plasma etching technique is employed if the organic thin-film multiple layers 11 are relatively thin.

The width of the organic thin-film multiple layers 11 to be removed, i.e., the width of the etched groove 21, is wider than the thickness of saw blade 30. For example, if the thickness of the blade 30 is 200 $\mu$m, the width to be removed ranges from 500 $\mu$m to 1 mm. Cutting section 40 resulting from the plasma etching of the organic thin-film multiple layers 11 is rough as compared to that resulting from sawing with the blade 30.

Referring to FIGS. 5(*a*) to 5(*d*) and FIGS. 6(*a*) to 6(*d*), there is described a third embodiment according to the present invention. The third embodiment is substantially the same as the first embodiment except the use of ion beam etching illustrated in FIGS. 5(*b*) and 6(*b*) instead of the etching with excimer laser. Thus, the operations illustrated in FIGS. 5(*a*) and 6(*a*), FIGS. 5(*c*) and 6(*c*), and FIGS. 5(*d*) and 6(*d*) are the same as those illustrated in FIGS. 1(*a*) and 2(*a*), FIGS. 1(*c*) and 2(*c*), and FIGS. 1(*d*) and 2(*d*), respectively.

As shown in FIGS. 5(*b*) and 6(*b*), the ion beam etching is used to remove organic thin-film multiple layers 11 along scribe line 31 to form etched groove 21. In this technique, a resist mask 92 is applied to protect the portions of the organic thin-film layers 11 that are not to be etched away. The resist mask 92 is in the form of optical resist and made by optical lithography technique. The thickness of the resist 92 ranges from 10 $\mu$m to 50 $\mu$m. The wafer with the resist 92 is placed in a chamber that is evacuated. A small amount of argon gas is allowed back into the chamber. An electromagnetic is the applied, and the portion along the scribe line that is not protected by the resist 92 is etched away by the excited etchant ions 100.

Speed at which organic resin is etched away by the ion beam etching is slow as compared to speed at which the organic resin is etched away by the excimer laser. Thus, the ion beam etching technique is employed if the organic thin-film multiple layers 11 are relatively thin.

The width of the organic thin-film multiple layers 11 to be removed, i.e., the width of the etched groove 21, is wider than the thickness of saw blade 30. For example, if the thickness of the blade 30 is 200 $\mu$m, the width to be removed ranges from 500 $\mu$m to 1 mm. Cutting section 40 resulting from the ion beam etching of the organic thin-film multiple layers 11 is rough as compared to that resulting from sawing with the blade 30. After ion beam etching, the resist 92 is removed in a solvent such as methyl ethyl ketone because the resist is soluble in the solvent.

Referring to FIGS. 7(*a*) to 7(*d*) and FIGS. 8(*a*) to 8(*d*), there is described a fourth embodiment according to the present invention. The fourth embodiment is substantially the same as the first embodiment except the use of sand blasting illustrated in FIGS. 5(*b*) and 6(*b*) instead of the etching with excimer laser. Thus, the operations illustrated in FIGS. 7(*a*) and 8(*a*), FIGS. 7(*c*) and 8(*c*), and FIGS. 7(*d*) and 8(*d*) are the same as those illustrated in FIGS. 1(*a*) and 2(*a*), FIGS. 1(*c*) and 2(*c*), and FIGS. 1(*d*) and 2(*d*), respectively.

As shown in FIGS. 7(*b*) and 8(*b*), the sand blasting technique is used to remove organic thin-film multiple layers 11 along scribe line 31 to form etched groove 21. In this technique, a metal mask 61 is applied to protect the portions of the organic thin-film layers 11 that are not to be etched away. A resist mask may be used instead of the metal mask 61. A wafer with the metal mask 61 is placed in a sand blaster, and the portion along the scribe line 31 that is not protected by the mask 61 etched away by the radiated sand 140.

Speed at which organic resin is etched away by the sand blasting is high as compared to speed at which the organic resin is etched away by the ion beam etching. Thus, the sand blasting technique is employed if the organic thin-film multiple layers 11 are relatively thick.

The width of the organic thin-film multiple layers 11 to be removed, i.e., the width of the etched groove 21, is wider than the thickness of saw blade 30. For example, if the thickness of the blade 30 is 200 μm, the width to be removed ranges from 500 μm to 1 mm. Cutting section 40 resulting from the sand blasting of the organic thin-film multiple layers 11 is rough as compared to that resulting from sawing with the blade 30.

In each of the embodiments, the ceramic multiple-layered substrate is used for description. The present invention is applicable to other types of substrate with organic thin-film multiple layers, such as, a glass ceramic substrate, a sapphire substrate and a silicone substrate.

Referring to FIGS. 9(a) to 9(c) and FIGS. 10(a) to 10(c), the before discussed prior art is explained.

Figure 9A:
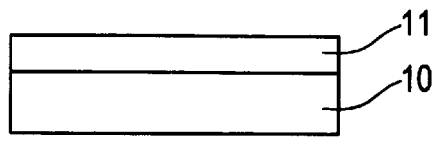
FIGS. 9(*a*), 9(*b*) and 9(*c*) are schematic elevation diagrams illustrating various steps of the before discussed conventional method of separating die.
Figure 10A:
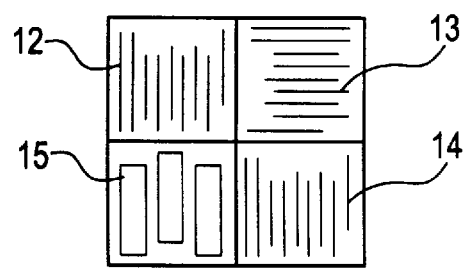
FIGS. 10(*a*), 10(*b*) and 10(*c*) are schematic plan diagrams illustrating the various processes of the conventional method.

FIGS. 9(a) and 10(a) show a wafer that is comprised of a ceramic multiple-layered substrate 10 with organic thin-film multiple layers 11.

Figure 9B:
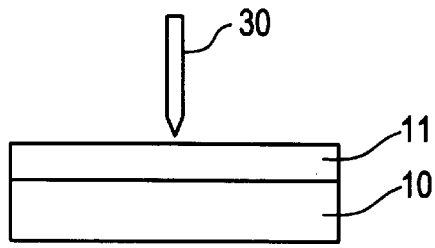
Figure 10B:
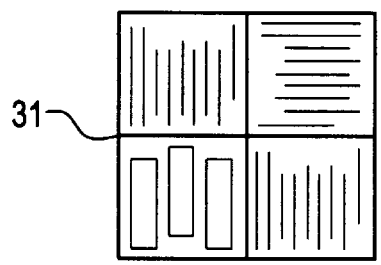

FIGS. 9(b) and 10(b) show a step of separating the wafer with a saw blade 30. In this step, the blade 30 is drawn through the organic thin-film multiple layers 11 and ceramic multiple-layered substrate 10 along scribe line 31 to cut them in a single operation. The wafer is very hard. Thus, the saw blade 30 must repeat its operation several times along the same scribe line 31. For example, the saw blade 31 must repeat its operation four times along the same scribe line 31 for separating the wafer that consists of ceramic multiple-layered substrate with 2 mm thick and organic thin-film multiple layers with 200 μm thick.

Figure 9C:
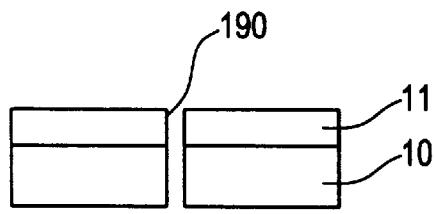
Figure 10C:
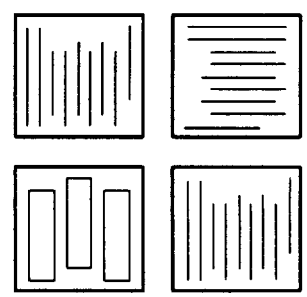

FIGS. 9(c) and 10(c) show the wafer after having been separated by the saw blade 30. The cutting section 190 resulting from sawing the organic thin-film multiple layers 11 with the saw blade 30 is completely flat. Thus, the cutting section 190 is subjected to stress derived from difference in coefficient of thermal expansion between the organic multiple layers 11 and ceramic substrate 10.

Figure 11A:
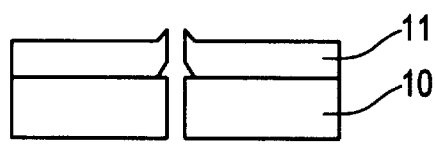
FIGS. 11(*a*) and 11(*b*) are schematic diagrams illustrating two kinds of defects mentioned before during wafer scribe according to the conventional method.
Figure 11B:
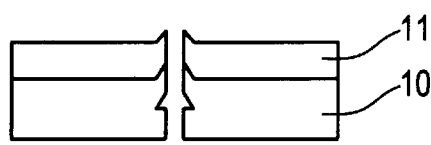

FIG. 11(a) shows a defect mode in which the organic thin-film multiple layers 11 peel off from the ceramic multiple-layered substrate 10. FIG. 11(b) shows another defect mode in which layers of the ceramic multiple-layered substrate 10 are separated open. This defect is often found in a glass ceramic multiple-layered substrate that is relatively weak mechanically.

From the preceding description, it is now apparent that the cutting section 40 resulting from etching the organic thin-film multiple layers 11 is rough as compared to the cutting section 190 resulting from sawing with the blade 30. This roughness contributes to dissipation of the stress in the cutting section, preventing occurrence of the defects encountered in the prior art.

What is claimed is:

1. A method of separating a wafer into individual dies, the method comprising the steps of:

forming a substrate of a ceramic material;

forming organic multiple layers over the surface of said ceramic substrate;

removing a portion of said organic multiple layers along a scribe line to form a groove to expose a portion of the surface of said ceramic substrate, said removing step forming two spaced parallel side walls defined by peripheral edges of the organic multiple layers, said side walls being connected to and extending from said ceramic substrate and cooperating with said exposed portion of the surface of said ceramic substrate to define said groove, said exposed portion being flat and extending across the scribe line;

inserting a saw blade that has a thickness less than a width of said groove into said groove out of interference contact with said two spaced parallel side walls; and sawing said substrate inwardly from said exposed portion thereof along the scribe line with said saw blade.

2. A method as claimed in claim 1, wherein said removing step includes the step of irradiating laser beam of excimer laser to remove said portion of the organic multiple layers.

3. A method as claimed in claim 1, wherein said removing step includes the step of plasma etching said portion of the organic multiple layers with excited etchant ions.

4. A method as claimed in claim 1, wherein said removing step includes the step of etching said portion of the organic multiple layers with ion beam.

5. A method as claimed in claim 1, wherein said removing step includes the step of sand blasting to etch said portion of the organic multiple layers.

* * * * *